(12) United States Patent
Sze et al.

(10) Patent No.: US 8,294,603 B2
(45) Date of Patent: Oct. 23, 2012

(54) SYSTEM AND METHOD FOR PROVIDING HIGH THROUGHPUT ENTROPY CODING USING SYNTAX ELEMENT PARTITIONING

(75) Inventors: Vivienne Sze, Toronto (CA); Anantha P. Chandrakasan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/827,872

(22) Filed: Jun. 30, 2010

(65) Prior Publication Data

US 2011/0001643 A1    Jan. 6, 2011

Related U.S. Application Data

(60) Provisional application No. 61/222,092, filed on Jun. 30, 2009.

(51) Int. Cl.
*H03M 7/00*    (2006.01)

(52) U.S. Cl. .......................................... 341/107; 341/50

(58) Field of Classification Search .................. 341/107, 341/50, 51; 382/232
See application file for complete search history.

(56) References Cited

U.S. PATENT DOCUMENTS

| | | | |
|---|---|---|---|
| 7,747,427 B2 * | 6/2010 | Lee et al. | 704/2 |
| 7,932,843 B2 * | 4/2011 | Demircin et al. | 341/107 |
| 2005/0001746 A1 | 1/2005 | Sankaran | |
| 2006/0233260 A1 | 10/2006 | Watanabe | |
| 2008/0112489 A1 | 5/2008 | Malladi et al. | |
| 2008/0276078 A1 | 11/2008 | Hu | |
| 2009/0079602 A1 | 3/2009 | Sze et al. | |
| 2009/0168868 A1 * | 7/2009 | Jahanghir | 375/240.02 |
| 2010/0098155 A1 * | 4/2010 | Demircin et al. | 375/240.02 |
| 2010/0118960 A1 * | 5/2010 | Nonogaki | 375/240.16 |

* cited by examiner

*Primary Examiner* — Peguy Jean Pierre
(74) *Attorney, Agent, or Firm* — Peter A. Nieves; Sheehan Phinney Bass + Green, P.A.

(57) ABSTRACT

A system and method for providing high throughput entropy coding contains the steps of: dividing syntax elements of video into one or more group of syntax elements; placing each group into a separate partition, resulting in more than one partition; and processing more than one of the more than one partition in parallel using entropy coding.

14 Claims, 11 Drawing Sheets

SYSTEM AND METHOD FOR PROVIDING HIGH THROUGHPUT ENTROPY CODING USING SYNTAX ELEMENT PARTITIONING

CROSS-REFERENCE TO RELATED APPLICATIONS

The present application claims priority to U.S. Provisional Application entitled, "SYSTEM AND METHOD FOR PROVIDING HIGH THROUGHPUT CONTEXT BASED ADAPTIVE BINARY ARITHMETIC CODING (CABAC) USING SYNTAX ELEMENT PARTITIONING," having patent application Ser. No. 61/222,092, filed Jun. 30, 2009, which is entirely incorporated herein by reference.

GOVERNMENT SUPPORT

This invention was made with Canadian government support under Grant Number F3920201 awarded by the Natural Sciences and Engineering Research Council of Canada. The government has certain rights in this invention.

FIELD OF THE INVENTION

The present invention relates to video compression, and more particularly, provides functionality for compressing video using syntax element partitioning, as well as hardware for performing this in an efficient manner.

BACKGROUND OF THE INVENTION

Given the growing pervasiveness of multimedia in recent years, one important application that merits improvement is next generation video coding and decoding. Next generation video coding and decoding has to address and support higher resolution and higher frame rates, which require high processing performance.

As is well known, video coding is required to overcome the limitations and costs of transmission bandwidth and data storage. Video codecs, which are devices or software that enable video compression and/or decompression for digital video, can be loosely classified into two categories: low power; and high performance. Both categories of video codecs require improvement. As an example, as video requirements of multimedia devices continue to become more demanding, such demands, especially with video requirements, require such multimedia devices to provide high video performance, however, increases in video performance are very demanding on processors and application specific integrated circuits (ASICs), resulting in high power consumption. For mobile devices, as well as other devices, low power consumption is a key consideration. Specific to mobile devices, low power consumption translates to reduced size, decreased weight, and lower cost. In addition, for non-mobile devices, it is still desirable to decrease power consumption to decrease costs associated with power consumption.

Real-time low-latency video playback is required for popular applications such as, but not limited to, video conferencing. For real-time video playback, a coded video picture should be decoded within an inter-frame time interval (e.g., 33.3 ms for 30 fps).

Low power video playback is an important requirement for battery-operated mobile devices, such as, but not limited to, cellular telephones. An effective method of power reduction is to trade-off performance (speed) for power via voltage scaling. At lower voltages, less energy is consumed per operation however, each operation takes longer to complete. This reduction in speed can be compensated for by increasing the number of parallel operations performed by the battery-operated devices. In other words, the hardware must be designed to operate faster than the target performance, namely, the target frame rate and resolution, at nominal voltage, such that at lower voltage the performance of the hardware would reach the target performance.

Accordingly, parallelism plays a key role in achieving both real-time and low power video playback. With the increasing frame rate and resolution required for future video coding applications, the need for parallelism in the video is ever more important. The amount of parallelism that can be used is limited by the video coding standard, or algorithm used by the hardware. Certain dependencies within the video coding standard make it difficult to perform operations in parallel. As an example, the entropy coding engine called. Context-based Adaptive Binary Arithmetic Coding (CABAC) has been identified as a key bottleneck in H.264/AVC video decoders. Parallelism is difficult to achieve with the existing H.264/AVC CABAC due to its inherent serial nature and strong data dependencies, specifically, the H.264/AVC CABAC is of a recursive nature. Consequently, it is difficult to parallelize without sacrificing coding efficiency, power, delay, and area—all of which are important to video encoding/decoding. For instance, within the H.264/AVC standard, a frame can be broken up into multiple independent H.264/AVC slices to enable parallel processing in the CABAC, but this comes at a cost of significant reduction in the coding efficiency, namely, poorer compression, since redundancy cannot be eliminated between the slices.

Increased throughput of a CABAC decoding engine is desirable. Unfortunately, data is decoded by the CABAC decoding engine in a serial manner, which is performed one binary symbol (bin) at a time. It is desirable to increase the number of bins processed per second, or every cycle. As an example, the throughput of a H.264/AVC CABAC decoding engine is measured by the number of bins it can decode per second (bins/sec). Throughput requirement for video decoding can exceed 2 Gbins/sec.

CABAC is a form of entropy coding that is executed by a processor. Entropy coding involves compressing data based on the probability of its occurrence. A simple example is wanting to assign short codewords (fewer bits) to elements that occur frequently and longer codewords (more bits) to elements that occur less frequently. In the case of video coding, CABAC is used to compress syntax elements, such as, for example, motion vectors, macroblock types, coefficients, and significance maps. Macroblocks are 16×16 blocks of pixels. Syntax elements are used to describe properties of a macroblock. Syntax elements are also composed of bins, which are processed by the CABAC encoding/decoding engine. Bins dictate the workload of the CABAC encoding/decoding engine. Consequently, speed/throughput is stated in bins/sec. Referring to a CABAC encoder, the CABAC encoder processes data as follows: Input: Syntax Elements (bins)→Output: encoded bits. Alternatively, referring to a CABAC decoder, the CABAC decoder processes the data as follows: Input: encoded bits→Output: decoded bins (also referred to as syntax elements).

There have been several proposals for the next generation video coding standard that present various ways to increase the throughput of the CABAC engine. Certain contributions have looked at various ways of using slices to increase parallel processing for CABAC. Unfortunately, methods provided by such contributions come at the cost of coding efficiency penalty when compared to H.264/AVC, having a single slice per frame, and do not address hardware implementation complexities. This coding efficiency penalty of the slice approach can be attributed to three key sources: 1) reduced context training; 2) no context selection across slices; and 3) start code and header for each slice. Another critical drawback of these approaches is that the entire CABAC engine needs to be replicated, which significantly increases area costs.

Thus, a heretofore unaddressed need exists in the industry to address the aforementioned deficiencies and inadequacies.

SUMMARY OF THE INVENTION

Embodiments of the present invention provide a system and method for providing high throughput entropy coding using syntax element partitioning. Briefly described, in architecture, one embodiment of the system, among others, can be implemented as follows. The system contains at least two entropy coding engines and a computer. The computer has a memory and a processor configured by the memory to perform the steps of: dividing syntax elements of video into one or more group of syntax elements; placing each group into a separate partition, resulting in more than one partition; and providing each separate partition to a separate one of the at least two entropy coding engines, wherein the at least two entropy coding engines process the separate partitions in parallel using entropy coding.

The present invention can also be viewed as providing methods for providing high throughput entropy coding. In this regard, one embodiment of such a method, among others, can be broadly summarized by the following steps: dividing syntax elements of video into one or more group of syntax elements; placing each group into a separate partition, resulting in more than one partition; and processing more than one of the more than one partition in parallel using entropy coding.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
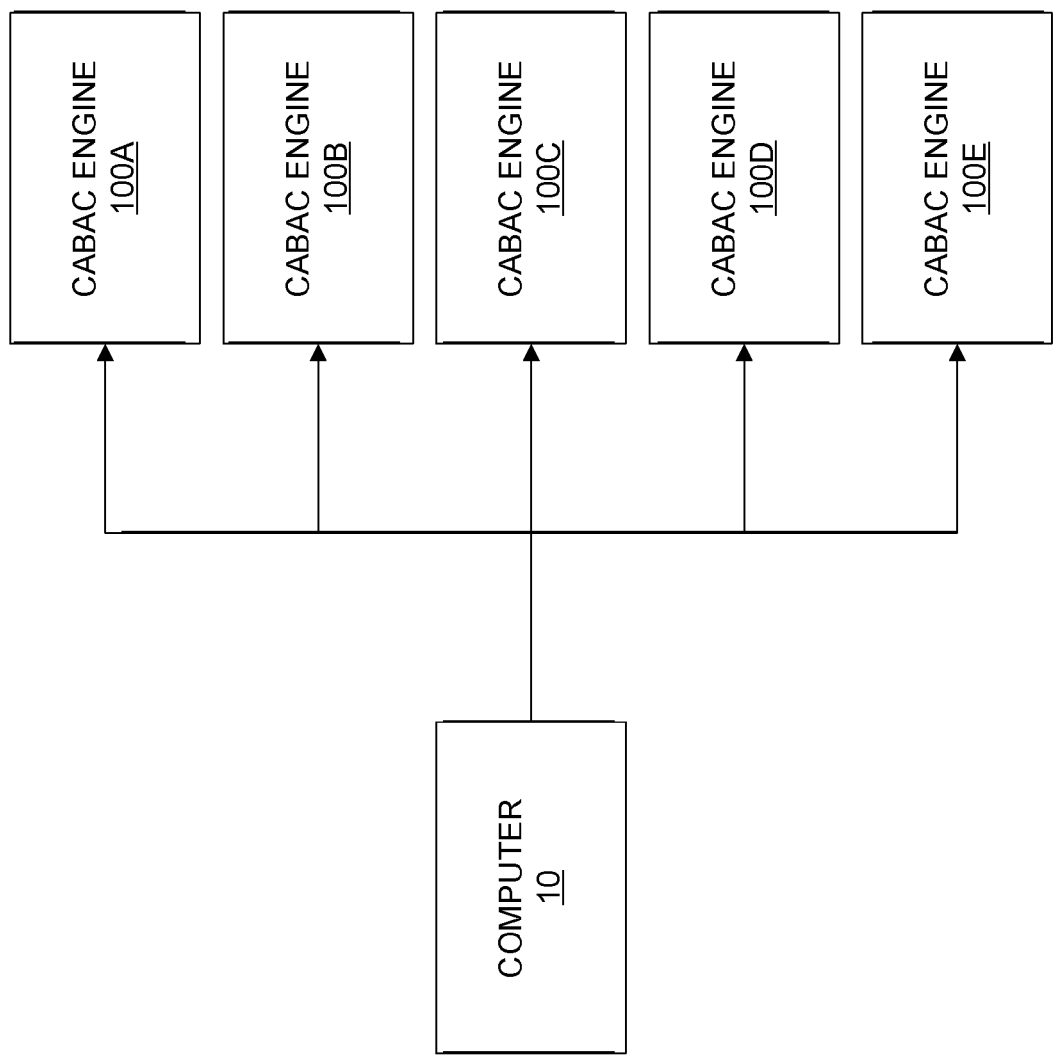
FIG. 1 is a schematic diagram illustrating the present system in accordance with an embodiment of the invention.

The present system and method provide parallel architectures and parallel processing for delivering power and performance required for video coding, while achieving high processing performance with low power consumption. The present system and method provides an approach that increases parallelism without large overhead costs by changing functionality associated with entropy coding. Specifically, the present system and method changes the order with which data is processed in an entropy coding engine to eliminate certain data dependencies, enabling parallel processing. The present description provides the example of using a CABAC encoding/decoding engine (hereafter, "the CABAC engine") as the entropy coding engine, although it should be noted that the present invention is not limited to using a CABAC engine as the entropy coding engine. In the present description, it is noted that a CABAC encoder is a CABAC encoding engine and a CABAC decoder is a CABAC decoding engine.

It is important to note that although the CABAC engine posses a greater problem during video decoding than video encoding, it is still useful to enable parallelism during encoding for the same power and performance reasons. Specifically, the present system and method parallelizes the CABAC engine both during video encoding and decoding.

In video decoding, the frame rate and resolution of the playback video dictates the performance requirement of the video decoder hardware. Over the past years, video has become increasingly ubiquitous due to the reduction in storage and transmission costs. The number of different types of video content has been growing rapidly ranging from professional cinema to news reports to, most recently, user-generated content. In addition, the numerous modes of transmission of the video have also expanded from broadcast and playback of local storage material (e.g. DVD), to streaming across the Internet and cellular network. Both of these factors cause the frame rate and resolution of today's video content to vary widely. For instance, high definition (e.g. 720HD (1280×720) or 1080HD (1920×1080)) is used for playback movies and broadcast television on a high resolution monitor. A higher frame rate (e.g. 60 or 120 fps) is used for high-action sports. Video conferencing and streaming media can be done at lower resolutions (e.g. CIF (352×288) or VGA (640×480)) and frame rates (e.g. 15 or 30 fps) for display on a phone. A highly scalable video decoder is needed to support the wide variety of encoded sequences. The present system and method addresses this need.

In addition, the use of video playback on handheld battery-operated devices is increasingly common. It is expected that a video decoder on a cellphone can playback different types of video under various use cases. For instance, it should be able to playback low to medium resolution/frame rate videos locally on the phone that perhaps were transmitted over a low bandwidth network; with the growing popularity of video capture on a cellphone, it may also be convenient to be able to connect the phone to a monitor, or use a pico projector on the phone, and playback high resolution and fast frame rate sequences. Having a single video decoder ASIC that is scalable and can be used for all these applications is convenient and cost effective. Consequently, it is important to minimize and scale the power across this wide range.

A trade-off between power and performance (speed) can be achieved using voltage and frequency scaling. Specifically, for a given workload or target performance, the power can be minimized by scaling down the voltage and frequency until the performance is just met. As a result, the power consumed for a given application can be minimized. Parallel algorithms, such as the present syntax element partitioning, enables a third dimension of scalability with coding efficiency. For instance, increasing the number of parallel partitions enables the frequency and voltage to be scaled down even further for the same target performance, for additional power savings at the cost of lower coding efficiency.

This approach can also be applied to the video encoding hardware where rather than having the video dictate the performance requirement for video decoding, the user has the ability to select the power-performance-coding efficiency point depending on the desired application.

As is well known by those having ordinary skill in the art, video compression is achieved by removing redundant information in a video sequence. Many different video coding standards exist, examples of which include MPEG-1, MPEG-2, MPEG-4, H.261, H.263, and H.264/AVC. It should be noted that the present invention is not intended to be limited in application of any specific video coding standard.

The following description is provided using the example of the H.264/AVC standard. In H.264/AVC, each frame of a video can be broken into several slices. Slices are self-contained such that they can be decoded without knowledge of other slices, which enables resynchronization. The slices are then divided into blocks of 16×16 pixels called macroblocks, which can then be further divided into blocks of 8×16, 16×8, 8×8, 4×8, 8×4, down to 4×4 pixels.

The present system and method, which provides syntax element parallelism, addresses the reduction of context training and context selection, which are listed as problems within the prior art. A context is a probability model used to estimate the statistics of a syntax element; the estimated probability of the syntax element is then used in its compression. Several contexts are allocated to each syntax element and the context selected for encoding/decoding a given syntax element depends on the properties of the macroblocks surrounding the current macroblock that is described by the syntax element being processed.

It is noted that the probabilities of the syntax elements are unknown at the beginning of decoding and are different for different video sequences. Consequently, one of the properties that give CABAC its high coding efficiency is that the contexts, which store the probabilities of the elements to be coded, are adaptive. Specifically, while encoding/decoding, the contexts undergo training to achieve an accurate estimate of the element probabilities. A better estimate results in better coding efficiency.

Entropy slices are similar to H.264/AVC slices as it breaks up the frame for parallel processing at the macroblock level (e.g., rows 1-20 belong to slice A and rows 21-40 belong to slice B). One of the drawbacks of breaking up a picture into several entropy slices is that there are fewer macroblocks and consequently syntax elements per slice. In order to enable parallel processing, the entropy slices should be independent of one another. This means that the entropy engine is restarted every entropy slice and that the context undergoes less training and can result in a poorer estimate of the probability. Almost half of the coding efficiency loss seen in the prior art is due to reduced training.

Key ideas addressed by the present invention for achieving high coding efficiency, also referred to as good compression, include:

1) Since different syntax elements have different statistics, different syntax elements should have different probability models (also known as the context). As an example, motion vectors will have a different probability distribution than coefficients.
2) Syntax elements that are spatially close to each other are typically correlated. As a result, contexts are selected based on surrounding syntax elements.
3) Accurately estimate the probability/contexts; probabilities of syntax elements are different depending on the video sequence and also will change throughout the video sequence. Consequently, in accordance with one embodiment of the invention, the context undergoes training during encoding/decoding to achieve an accurate estimate of the probability.

FIG. 1 is a schematic diagram illustrating the present system in accordance with an embodiment of the invention. It should be noted that the present system is located within the entropy coding stage of video coding.

Figure 2:
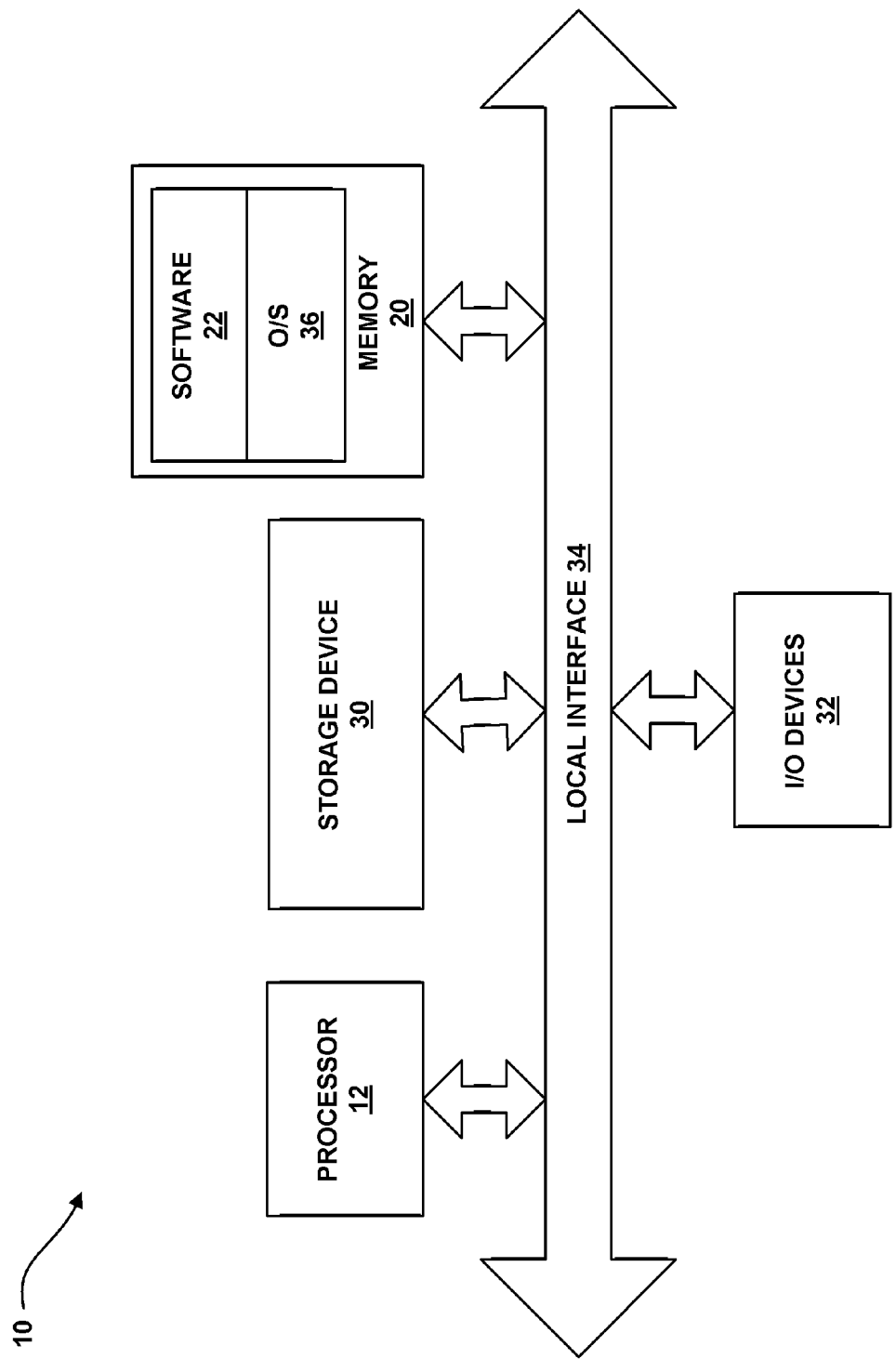
FIG. 2 further illustrates the generic computer of FIG. 1.

As shown by FIG. 1, the present system contains a computer 10 and a series of CABAC engines 100A, 100B, 100C, 100D, 100E (referred to together as 100) that are located in parallel. The computer 10 is provided to separate received data and send separated data to the different CABAC engines 100. Specifically, as described in further detail herein, the computer 10 receives a slice and groups syntax elements of the slice into separate partition groups. The computer 10 then attempts to allocate an approximately equal number of binary symbols to each CABAC engine 100 based on syntax elements, after which each CABAC engine 100 works in parallel to process received syntax elements into compressed bits for transmission as a bitstream. FIG. 2 further illustrates a generic computer, while FIG. 7 further illustrates an exemplary CABAC engine 100A.

Functionality of the present system can be implemented in software, firmware, hardware, or a combination thereof. In a first exemplary embodiment, a portion of the system is implemented in software, as an executable program, and is executed by a special or general-purpose computer, such as a personal computer, personal data assistant, smart phone, workstation, minicomputer, or mainframe computer. The following, in accordance with the first exemplary embodiment of the invention, provides an example where a portion of the functionality performed in accordance with the present invention is performed by a general purpose computer having software therein.

It should be noted that in accordance with another embodiment of the invention, all functionality of the computer may instead by provided by logic within an integrated circuit, or through a different medium.

Referring to FIG. 2, generally, in terms of hardware architecture, the computer 10 includes a processor 12, memory 20, storage device 30, and one or more input and/or output (I/O) devices 32 (or peripherals) that are communicatively coupled via a local interface 34. The local interface 34 can be, for example but not limited to, one or more buses or other wired or wireless connections, as is known in the art. The local interface 34 may have additional elements, which are omitted for simplicity, such as controllers, buffers (caches), drivers, repeaters, and receivers, to enable communications. Further, the local interface 34 may include address, control, and/or data connections to enable appropriate communications among the aforementioned components.

The processor 12 is a hardware device for executing software, particularly that stored in the memory 20. The processor 12 can be any custom made or commercially available processor, a central processing unit (CPU), an auxiliary processor among several processors associated with the computer 10, a semiconductor based microprocessor (in the form of a microchip or chip set), a macroprocessor, or generally any device for executing software instructions.

The memory 20 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 20 may incorporate electronic, magnetic, optical, and/or other types of storage media. Note that the memory 20 can have a distributed architecture, where various components are situated remote from one another, but can be accessed by the processor 12.

The software 22 in the memory 20 may include one or more separate programs, each of which contains an ordered listing of executable instructions for implementing logical functions of the computer 10, as described below. In the example of FIG. 2, the software 22 in the memory 20 defines the computer 10 functionality in accordance with the present invention. In addition, although not required, it is possible for the memory 20 to contain an operating system (O/S) 36. The operating system 36 essentially controls the execution of computer programs and provides scheduling, input-output control, file and data management, memory management, and communication control and related services.

Functionality of the computer 10 may be provided by a source program, executable program (object code), script, or any other entity containing a set of instructions to be performed. When a source program, then the program needs to be translated via a compiler, assembler, interpreter, or the like, which may or may not be included within the memory 20, so as to operate properly in connection with the O/S 36. Furthermore, the functionality of the computer 10 can be written as (a) an object oriented programming language, which has classes of data and methods, or (b) a procedure programming language, which has routines, subroutines, and/or functions.

The I/O devices 32 may include input devices, for example but not limited to, a touch screen, a keyboard, mouse, scanner, microphone, or other input device. Furthermore, the I/O devices 32 may also include output devices, for example but not limited to, a display, or other output devices. The I/O devices 32 may further include devices that communicate via both inputs and outputs, for instance but not limited to, a modulator/demodulator (modem; for accessing another device, system, or network), a radio frequency (RF), wireless, or other transceiver, a telephonic interface, a bridge, a router, or other devices that function both as an input and an output.

When the computer 10 is in operation, the processor 12 is configured to execute the software 22 stored within the memory 20, to communicate data to and from the memory 20, and to generally control operations of the computer 10 pursuant to the software 22. The software 22 and the O/S 36, in whole or in part, but typically the latter, are read by the processor 12, perhaps buffered within the processor 12, and then executed.

When the functionality of the computer 10 is implemented in software, as is shown in FIG. 2, it should be noted that the functionality can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The functionality can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The storage device 30 of the computer 10 may be one of many different types of storage device, including a stationary storage device or portable storage device. As an example, the storage device 30 may be a magnetic tape, disk, flash memory, volatile memory, or a different storage device. In addition, the storage device 30 may be a secure digital memory card or any other removable storage device 30.

Figure 3:
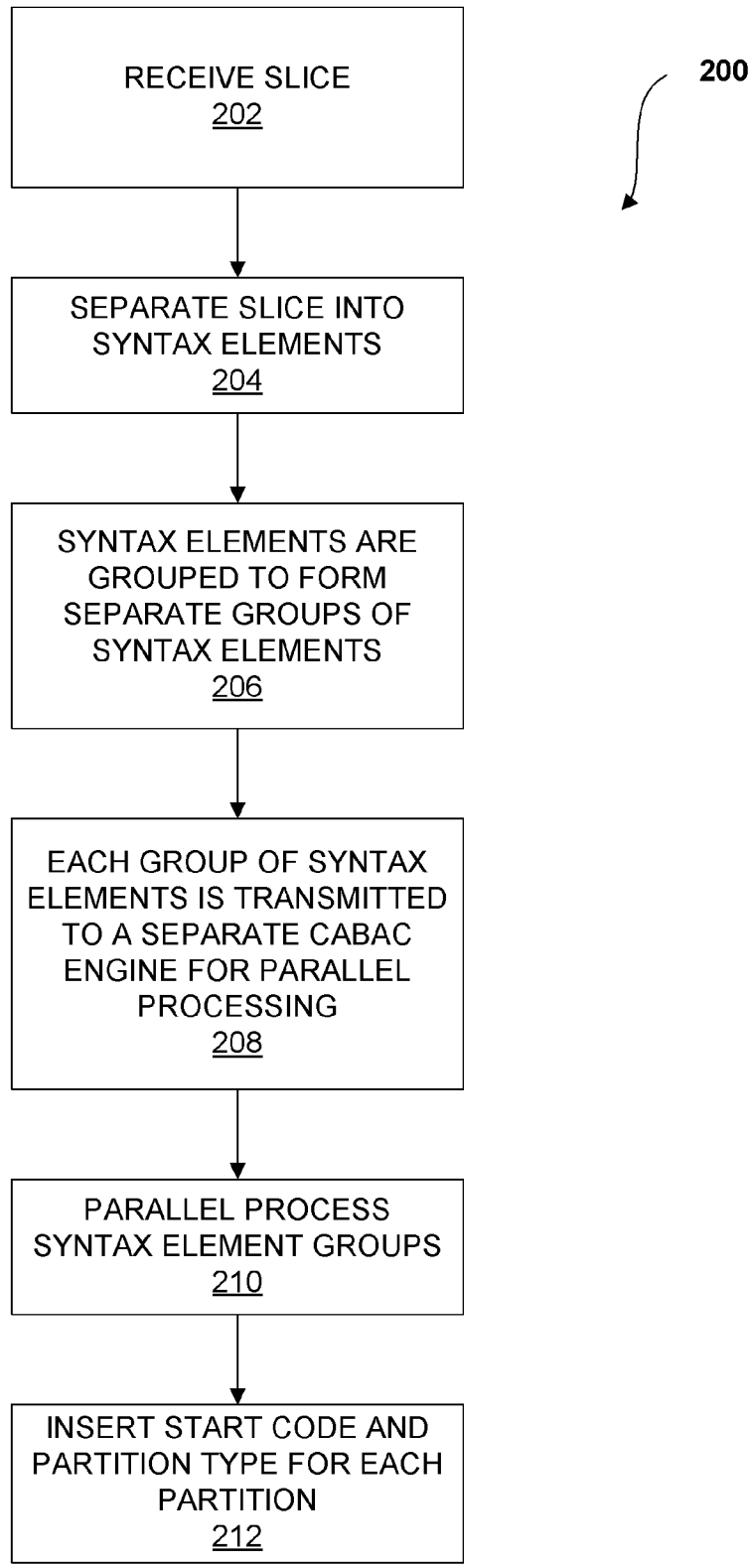
FIG. 3 is a flow chart providing a general description of the process used by the computer to separate received data into groups of syntax elements for transmission to separate CABAC engines for parallel processing, also referred to as encoding.

FIG. 3 is a flow chart 200 providing a general description of the process used by the computer 10 during encoding for separating received data into groups of syntax elements for transmission to separate CABAC engines 100 for parallel processing at the encoder. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

As shown by block 202 a slice is received by the computer 10. The slice is separated into syntax elements (block 204). Since one having ordinary skill in the art would know how to separate a slice into syntax elements, this process is not described in further detail herein.

As shown by block 206, the syntax elements are then grouped to form separate groups of syntax elements. Each group of syntax elements is then transmitted to a separate CABAC engine 100 for processing in parallel (block 208), after which the groups of syntax elements are parallel processed (block 210). For encoding, each CABAC engine 100 receives one group of syntax elements for processing from syntax elements to encoded bits. A start code and partition type is then added to each partition (block 212). An example of a partition type in a NAL unit value, as explained herein.

In accordance with the present invention, one or more of multiple different methods may be used to form the groups of syntax elements for transmission to the separate CABAC engines 100. The following provides examples of different methods that may be used to form the groups of syntax elements.

A first method that may be used to form groups includes running video processing simulations on multiple video streams using the CABAC engines 100 to determine an average number of bins per syntax element. After running video processing simulations a determination can be made regarding what is an average number of bins per syntax element. Syntax elements with a low number of bins can then be grouped together so as to distribute syntax elements into groups in as equal a manner as possible, resulting in groups of syntax elements having similar work distributions (i.e. similar number of bins).

A second method that may be used to form groups of syntax elements involves prior knowledge of an average number of bins per syntax element for a given video standard. Having such prior knowledge allows for prior grouping of syntax elements so as to provide similar workload for each CABAC engine 100. Received syntax elements are then sorted and grouped into the predefined different groups and each sorted group of received syntax elements is provided to a different CABAC engine 100 in accordance with the predefined distribution in a manner so as to provide a similar workload for each CABAC engine 100 during parallel processing.

As is known by those having ordinary skill in the art, there are many different types of syntax elements. As an example, there are currently twenty-one (21) types of syntax elements in the H.264/AVC standard. As previously mentioned, to reduce complexity, the present system and method provides for grouping of the syntax elements into multiple partitions, or groups, where an approximately equal number of binary symbols is allocated to each CABAC engine 100 based on syntax elements.

An example of groupings of syntax elements is shown by table 1 below. As an example, one can form five different partitions (groups) of syntax elements. In the example represented by table 1, a first group is entitled MBINFO, a second group is entitled PRED, a third group is entitled CBP, a fourth group is entitled SIGMAP, and a fifth group is entitled COEFF. The grouping of syntax elements is determined based on the distributions of their respective bins. In other words, it is ideal to make sure that the number of bins in each group is quite similar so that the workload of CABAC engines 100 is balanced.

TABLE 1

| Group | Syntax Element |
|---|---|
| MBINFO | Mb_skip_flag, mb_type, sub_mb_type, mb_field_decoded_flag, end_of_slice_flag |
| PRED | prev_intra4 × 4_pred_mode_flag, rem_intra4 × 4_pred_mode, prev_intra8 × 8_pred_mode_flag, rem_intra8 × 8_pred_mode, intra_chroma_pred_mode, ref_idx_10, ref_idx_11, mvd_10, mvd_11 |
| CBP | transform_size_8 × 8_flag, coded_block_pattern, coded_block_flag |
| SIGMAP | significant_coeff_flag, last_significant_coeff_flag |
| COEFF | coeff_abs_level_minus1, coeff_sign_flag |

Syntax element partitioning for CABAC can benefit in terms of error resilience. For instance, if the COEFF partition is corrupted, the other partitions can still be decoded and be used to generate an estimate of what the decoded frame should look like. Also, certain partitions contain more critical information than others (e.g. MBINFO is more critical than COEFF or SIGMAP). More error protection (e.g. block codes) can be used on partitions with more critical data.

It should be noted that the present invention is not limited to the abovementioned groups of syntax elements. Instead, one of many different groups of syntax elements may be provided, each having one or more other syntax elements.

It should also be noted that in accordance with an alternative embodiment of the invention, a single syntax element may be assigned to each CABAC engine 100. In addition, one or more different techniques may be used to continually modify which syntax elements fall into which groupings for assigning to CABAC engines 100.

While the abovementioned provides the example of two methods that may be used for grouping of syntax elements, one or more of many different methods may be used to group the syntax elements so as to provide similar work distribution for each of the CABAC engines 100. It should also be known that while it is preferred for the CABAC engines 100 to have a similar work distribution, in accordance with an alternative embodiment of the invention, the CABAC engines 100 may not have similar work distributions, while the CABAC engines 100 do still work in parallel.

Figure 4:
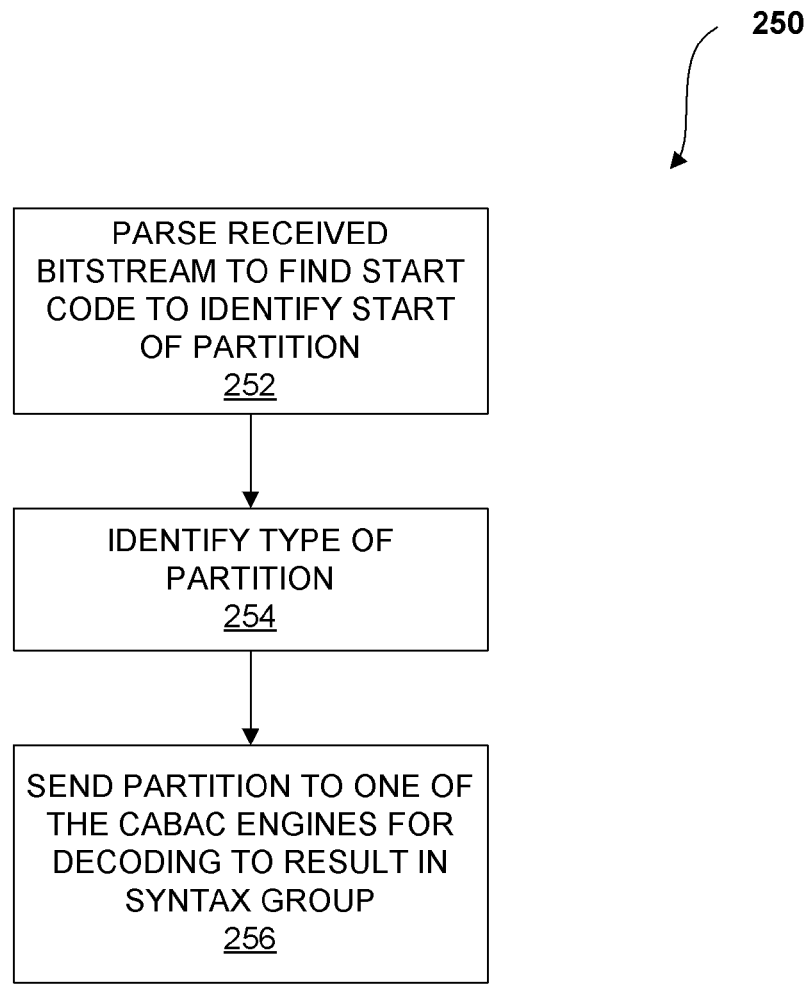
FIG. 4 is a flow chart providing a general description of the process used by the computer during decoding.

FIG. 4 is a flow chart 250 providing a general description of the process used by the computer 10 during decoding to separate received data into groups of syntax elements for transmission to separate CABAC engines 100 for parallel processing. As shown by block 252, the received bitstream is parsed to find the start code to identify the start of a partition. The type of partition is then identified (block 254). As shown by block 256, the partition is then sent to one of the CABAC engines for deciding, to result in a syntax group.

Figure 5:
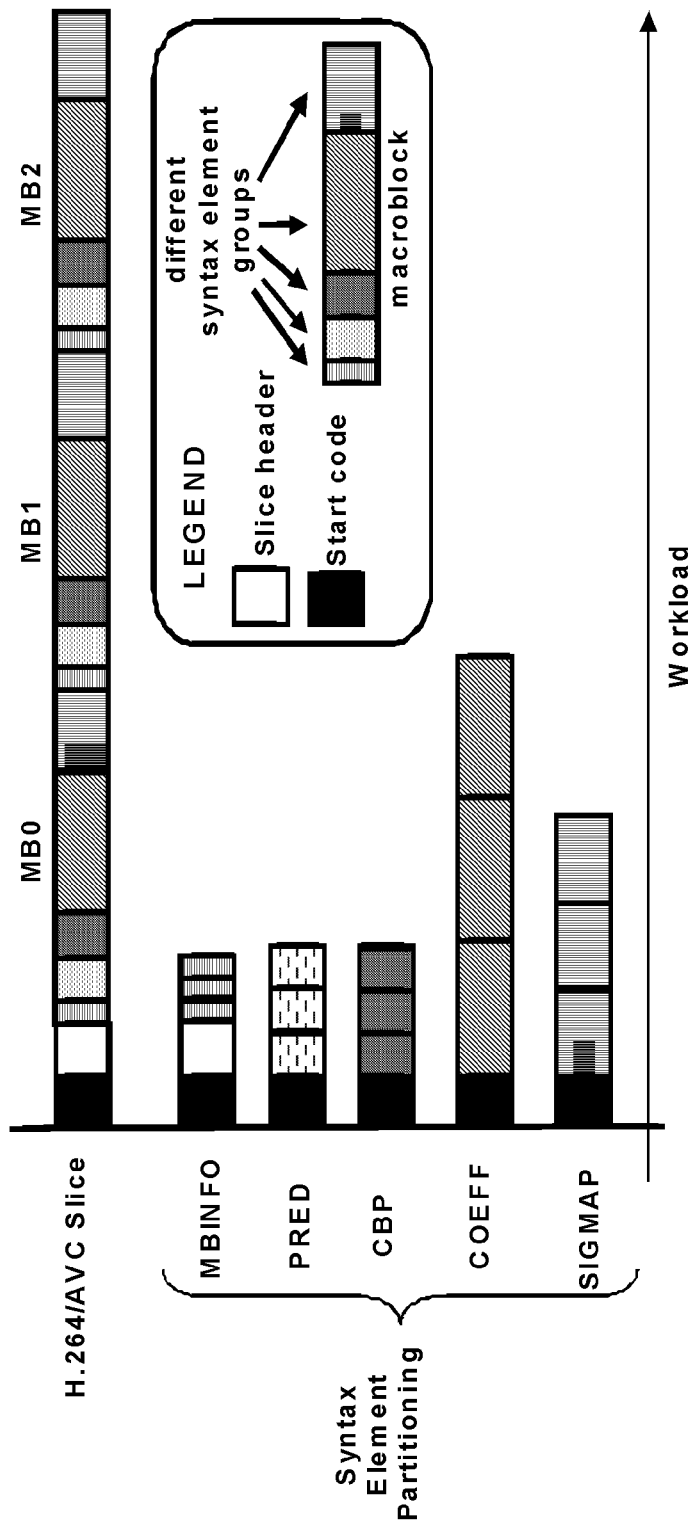
FIG. 5 is a schematic diagram further illustrating the separation of an H.264/AVC slice into syntax element groups that are mapped to different syntax element partitions (SEP) having similar workloads.

FIG. 5 is a schematic diagram further illustrating the separation of an H.264/AVC slice, as well as syntax element partitioning into syntax element groups having similar workloads. FIG. 5 illustrates the five syntax element groups previously mentioned, as well as how the COEFF and SIGMAP syntax element groups require more of a workload by associated CABAC engines 100. It is clear from FIG. 5 that the workload for each partition is much less than if all partitions were left in a single slice. In FIG. 5, macroblocks are represented as MB0, MB1, and MB2, while different syntax elements are represented by different shading patterns. A start code prefix for demarcation is used at the beginning of each partition.

A form of signaling is required to indicate which syntax element group is stored in a given partition. As an example, in the case of H.264/AVC, the overhead of signaling syntax element partitions can be minimized by assigning one of the several of the currently unspecified network abstraction layer (NAL) unit value (24 to 31), to each of the five partitions, which is sent in the NAL header. This assumes one partition per NAL unit. Alternatively, the information can be kept in a slice header. Similar to data partitioning, a shortened slice header can be sent for four of the five partitions, such that redundant slice header data is not repeated unnecessarily.

In accordance with an alternative embodiment of the invention, it may be desirable to decrease the number of syntax element groups to a smaller number. As an example, the overhead of the headers and start code can be reduced by adaptively combining the five groups into three partitions based on the quantization of the slice. To maximize throughput for varying quantization, the allocation of groups to each partition should be adaptive. It should be noted that decreasing the number of syntax element partitions allows for a decrease in the number of CABAC engines required, thereby decreasing area costs on a chip containing the CABAC engines.

Figure 6A:
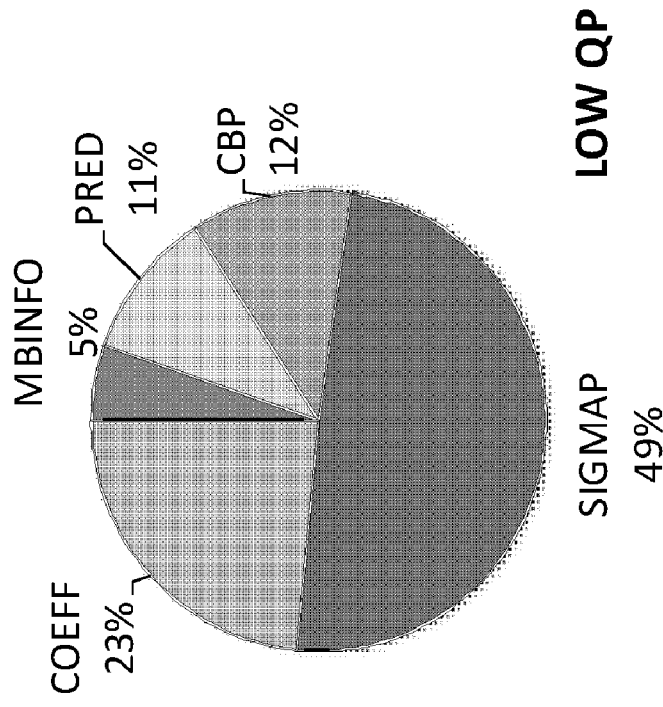
FIG. 6A and FIG. 6B are pie charts illustrating that the distribution of the bins per syntax element changes depending on the quantization of the slice.
Figure 6B:
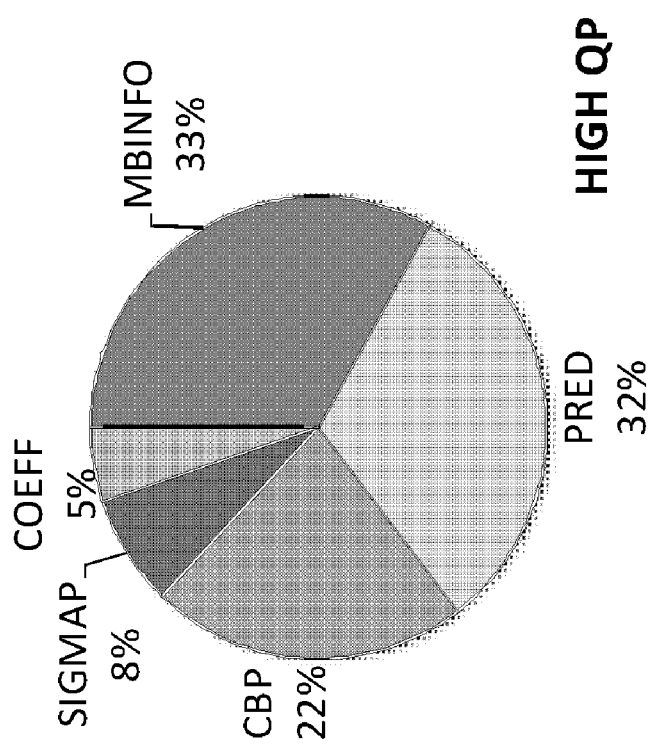

FIG. 6A and FIG. 6B are pie charts illustrating that the distribution of the bins per syntax element changes depending on the quantization of the slice. FIG. 6A provides the example of using a low quantization. As shown by FIG. 6A, the SIGMAP and COEFF groups contain most of the bin distributions for a low quantization, while the MBINFO, PRED, and CBP groups contain small portions of the bin distributions. As a result, if it was desirable to use three syntax partitions instead of five, the MBINFO, PRED, and CBP groups could be combined into one partition and provided to one CABAC engine, while the COEFF group is placed in one partition is sent to a second CABAC engine, and the SIGMAP group is placed in one partition is sent to a third CABAC engine.

FIG. 6B provides the example of using a high quantization. As shown by FIG. 6B, the MBINFO and PRED groups contain most of the bin distributions for a high quantization, while the CBP, SIGMAP, and COEFF groups contain small portions of the bin distributions. As a result, if it was desirable to use three syntax partitions instead of five, the CBP, SIGMAP, and COEFF groups could be combined into one partition and provided to one CABAC engine, while the MBINFO group is placed in one is sent to a second CABAC engine, and the PRED group is placed in one is sent to a third CABAC engine.

It should be noted that adaptive quantization is only necessary for P frames. In I frames, SIGMAP and COEFF tend to dominate regardless of quantization, and thus the high quantization mode is used. A quantization threshold can be different for each sequence and transmitted in the sequence parameter set. The quantization threshold can be selected by the encoder, for example by using either a two-pass approach or based on the number of non-zero coefficients.

In practice, the entropy encoder (CABAC encoder) takes as input the sequence of symbols (i.e. syntax elements) representing samples and control information and maps this onto a binary bitstream. In contrast with earlier compression stages, the entropy coding is lossless; the decoder will reproduce the exact sequence of symbols that was input to the entropy encoder during compression.

For exemplary purposes, H.264's implementation of CABAC creates the bitstream in three stages. The first stage is binarization. In binarization, each symbol to be output is uniquely mapped onto a binary string, called a bin string. Each bit position in the bin string is called a bin. Each bin is then passed to one of two coding modes: in regular coding mode, the next step, context modelling, is applied and the resulting context model and bin value are passed to a binary arithmetic coding engine; in bypass mode, context modelling is skipped and the bin is passed directly to a bypass coding engine, skipping the context modelling stage.

The second stage is context modeling. In context modeling, which is only used for regular coding mode, a bin is categorized for coding under a particular probability model. Each probability model has its state represented by a context variable, which is a pair (most probable symbol in $\{0, 1\}$, probability of less probable symbol). Arithmetic coding is applied using the chosen context model and updates its context variable.

The third stage in the implementation of CABAC is binary arithmetic coding. In binary arithmetic coding the value of the bin is used to update the context variable if applicable, and bits are output into the bitstream.

Figure 7:
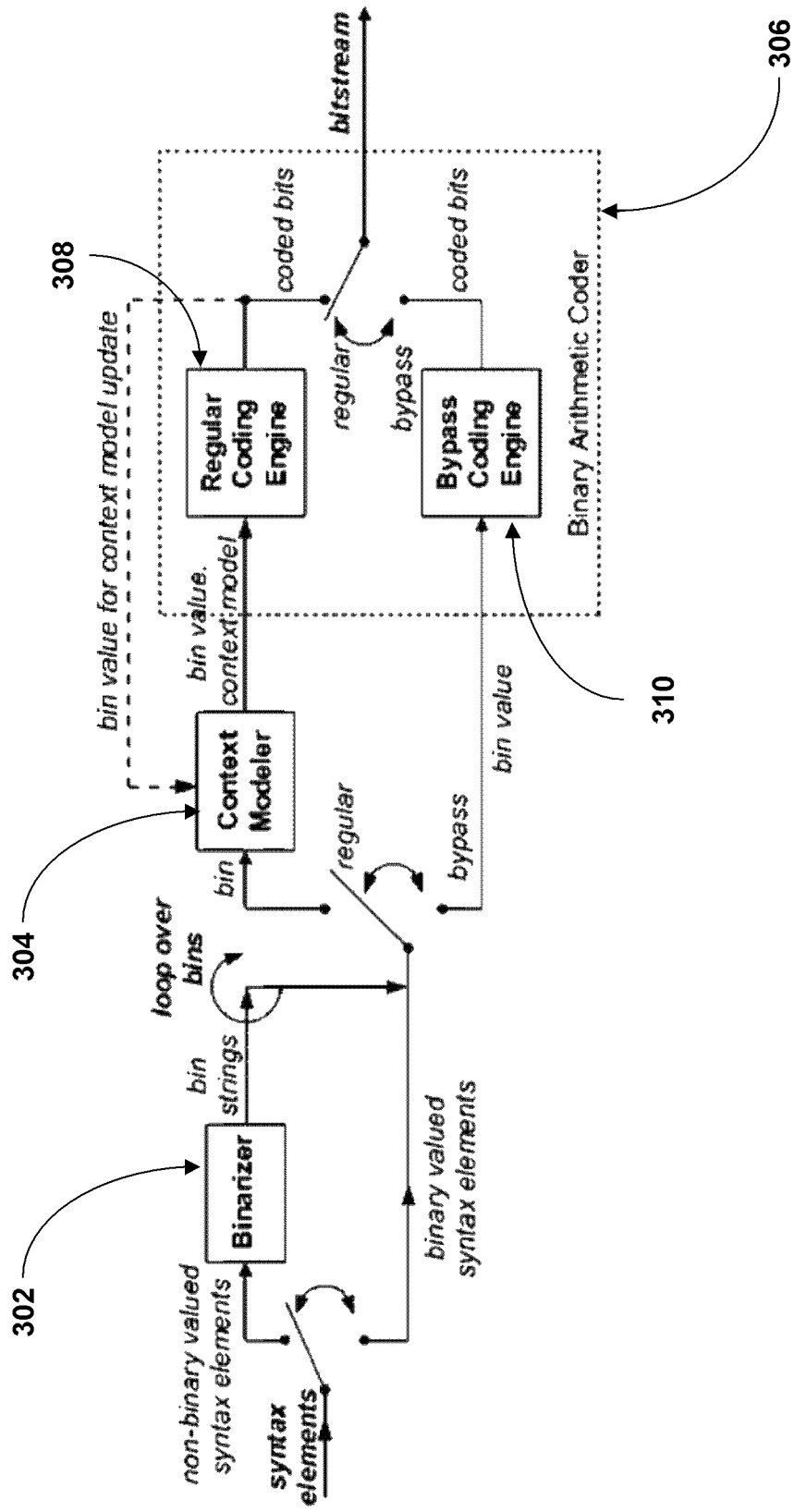
FIG. 7 is a block diagram illustrating a single CABAC encoder that would be used to encode a group of syntax elements, resulting in a bitstream.

FIG. 7 is a block diagram illustrating a single CABAC encoder 100A that would be used to encode a group of syntax elements, resulting in a bitstream. As shown by FIG. 7, the CABAC encoder 100A contains a binarizer 302, which receives non-binary syntax elements. The non-binary syntax elements pass through the binarizer 302 to be mapped to binary symbols, also referred to as bins. The bins are received by a context modeler 304. The context modeler 304 categorizes each bin for coding under a particular probability model, where each probability model has its state represented by a context variable that is a pair. Specifically, a probability model is assigned to each bin for compression of the bin, where the assigning depends on what syntax element each bin belongs to. Since this process is known to one having ordinary skill in the art, further description of probability model selection is not provided herein.

Since each CABAC engine 100 only processes a select group of syntax elements, namely, the syntax elements within the groups assigned to the CABAC engine 100, the context modeler 304 can be smaller in size. Specifically, with fewer syntax elements assigned to a specific CABAC engine 100, the context modeler 304 stores fewer probability models, namely, only the probability models associated with the group of syntax elements assigned to the CABAC engine 100.

A binary arithmetic coder 306 of the CABAC encoder 100A receives the bin and probability model for compression of the bin, to create compressed bits, resulting in a bitstream. As shown by FIG. 7, the binary arithmetic coder 306 contains a regular coding engine 308 and a bypass coding engine 310. The majority of the bins are compressed with the two forms of arithmetic coding, namely regular and bypass. Bypass coding assumes a uniform distribution for bins, while regular coding requires context modeling to estimate the bin distribution.

Figure 8:
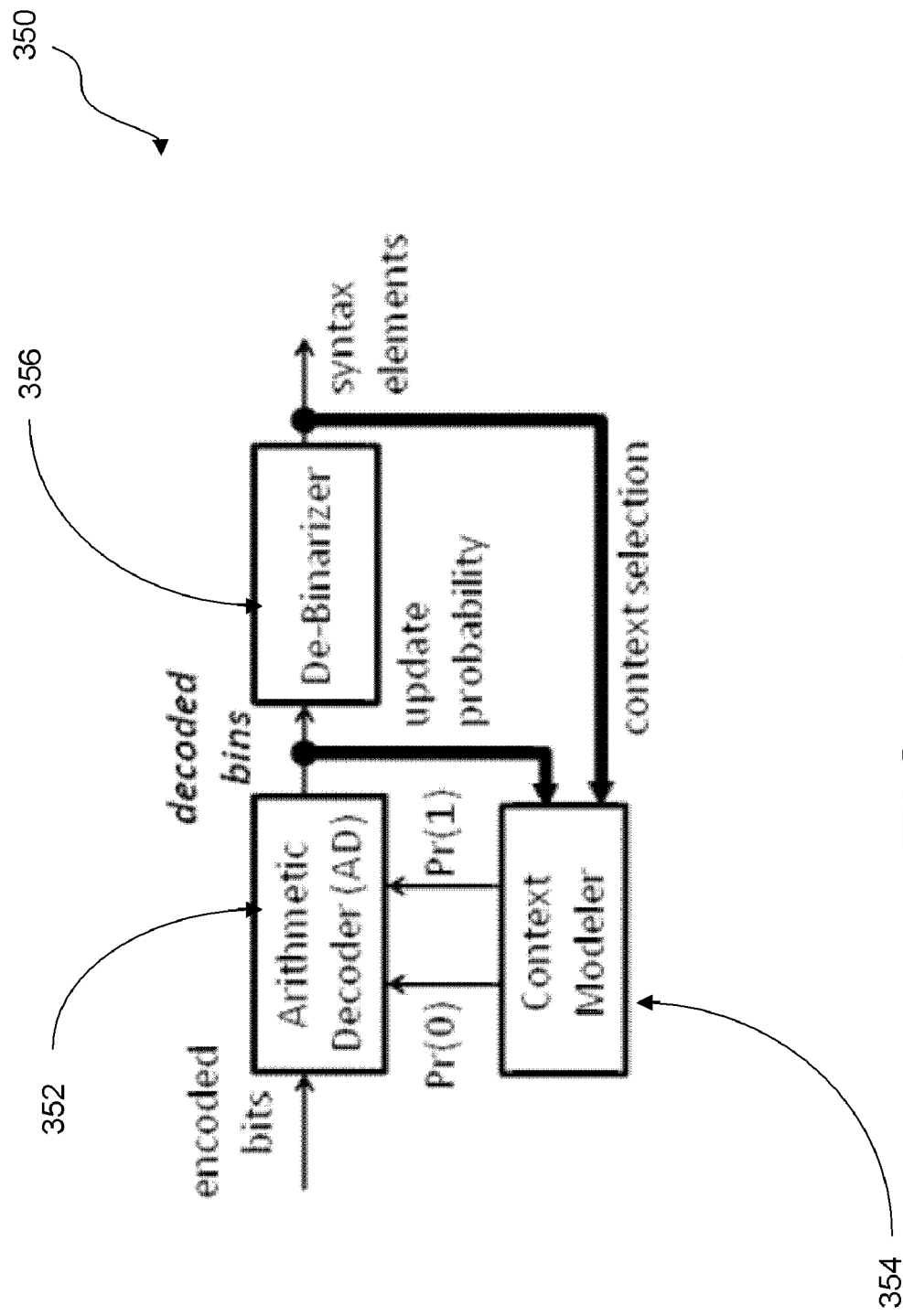
FIG. 8 is a block diagram illustrating a single CABAC decoder that would be used to decode received encoded bits, resulting in syntax elements.

FIG. 8 is a block diagram illustrating a single CABAC decoder 350 for decoding received bitstreams resulting in syntax elements. The computer receives an encoded bitstream and searches for start codes to find the beginning of partitions. The partitions are then sent to parallel CABAC decoders, one of which is illustrated by FIG. 8.

Encoded bits are received by an arithmetic decoder 352, which converts received encoded bits to decoded bins. A context modeler 354 is used for updating probabilities, and decoded bins are received by a de-binarizer 356, which debinarizes the decoded bins, resulting in the syntax elements.

Figure 9:
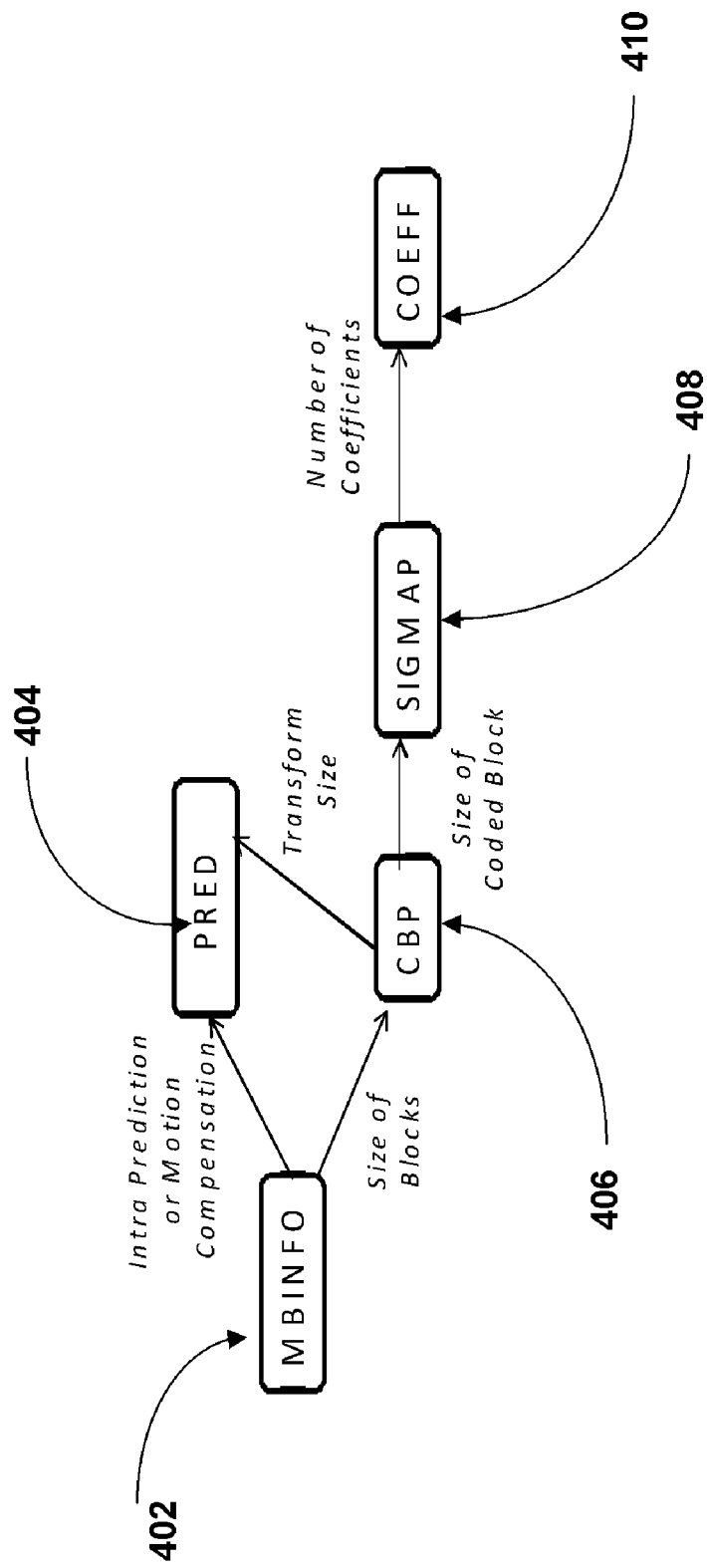
FIG. 9 is a schematic diagram illustrating dependencies between five syntax element groups (or partitions).

It should be noted that there exist dependencies between the five syntax element groups (or partitions). These dependencies are specifically important in the CABAC decoder 350. FIG. 9 better illustrates these dependencies. Each block in FIG. 9 represents the context modeler of each CABAC engine for each syntax element group (MBINFO 402, PRED 404, CBP 406, SIGMAP 408, COEFF 410), and the arrows between the blocks represent the dependencies between the context modeler for each syntax element group. As previously mentioned, the context modeler performs context selection to determine which probability model (context) to use for each bin. In order to assign probability models for bins in PRED 404 and decode the PRED syntax elements, it is necessary to know what type of prediction, namely, intra prediction or motion compensation, is used. The type of prediction used in a macroblock is determined from the syntax elements of MBINFO 402. Thus PRED 404 depends on MBINFO 402. Similarly, the size of the blocks in a macroblock is also determined by syntax elements of MBINFO 402, which are necessary to know before one can decode syntax elements in CBP 406. In addition, SIGMAP 408 depends on information contained in the syntax elements of CBP 406, and COEFF 410 depends on information contained in the syntax elements of SIGMAP 408. The abovementioned dependencies are provided for examplary purposes and the present invention is not intended to be limited by the same.

Figure 10:
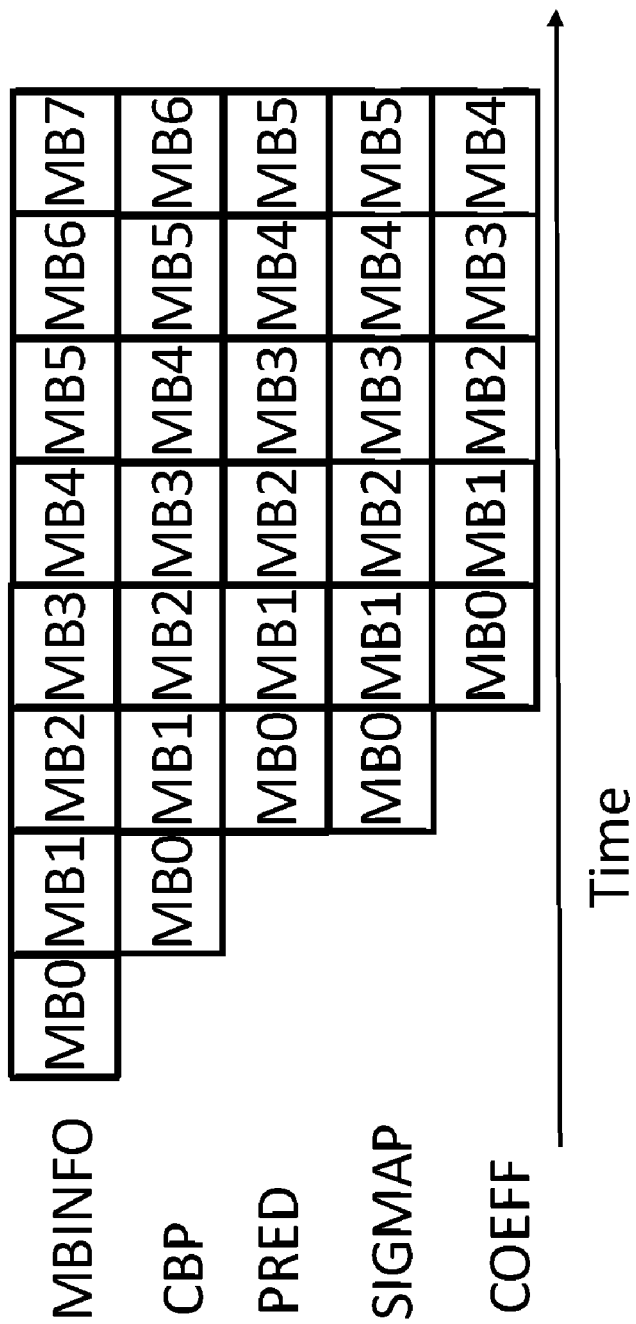
FIG. 10 illustrates the processing of different macroblocks over time by MBINFO, CBP, PRED, SIGMAP, and COEFF syntax element group CABAC engines, and how multiple macroblocks are processed in parallel.

Due to the dependencies illustrated by FIG. 9, the syntax element groups of different macroblocks will be processed at the same time. An illustration of this is provided by the schematic diagram of FIG. 10. FIG. 10 illustrates the processing of different macroblocks over time by the MBINFO, CBP, PRED, SIGMAP, and COEFF syntax element group CABAC engines, and how multiple macroblocks are processed in parallel. In FIG. 10, macroblocks are illustrated as MBx, where x represents the number of the macroblock being processed by the CABAC engine.

As illustrated by the example of FIG. 10, the COEFF syntax elements of macroblock MB0 cannot be processed until the SIGMAP syntax elements of MB0 have been decoded. In addition: the CBP syntax elements of macroblock MB0 cannot be processed until the MBINFO syntax elements of MB0 have been decoded; the PRED syntax elements of macroblock MB0 cannot be processed until the MBINFO syntax elements of MB0 have been decoded and the CBP syntax elements of MB0 have been decoded; and the SIGMAP syntax elements of macroblock MB0 cannot be processed until the CBP syntax elements of MB0 have been decoded. As a result, for example, the SIGMAP syntax elements of MB1 are processed at the same time as the COEFF syntax elements of MB0.

As previously mentioned, FIG. 10 also illustrates how macroblocks are processed in parallel. As an example, macroblock MB0 of the COEFF syntax element group, macroblock MB1 of the SIGMAP sysntax element group, macroblock MB1 of the PRED syntax element group, macroblock MB2 of the CBP syntax element group, and macroblock MB3 of the MBINFO syntax element group are all processed in parallel by their respective CABAC engines.

Figure 11:
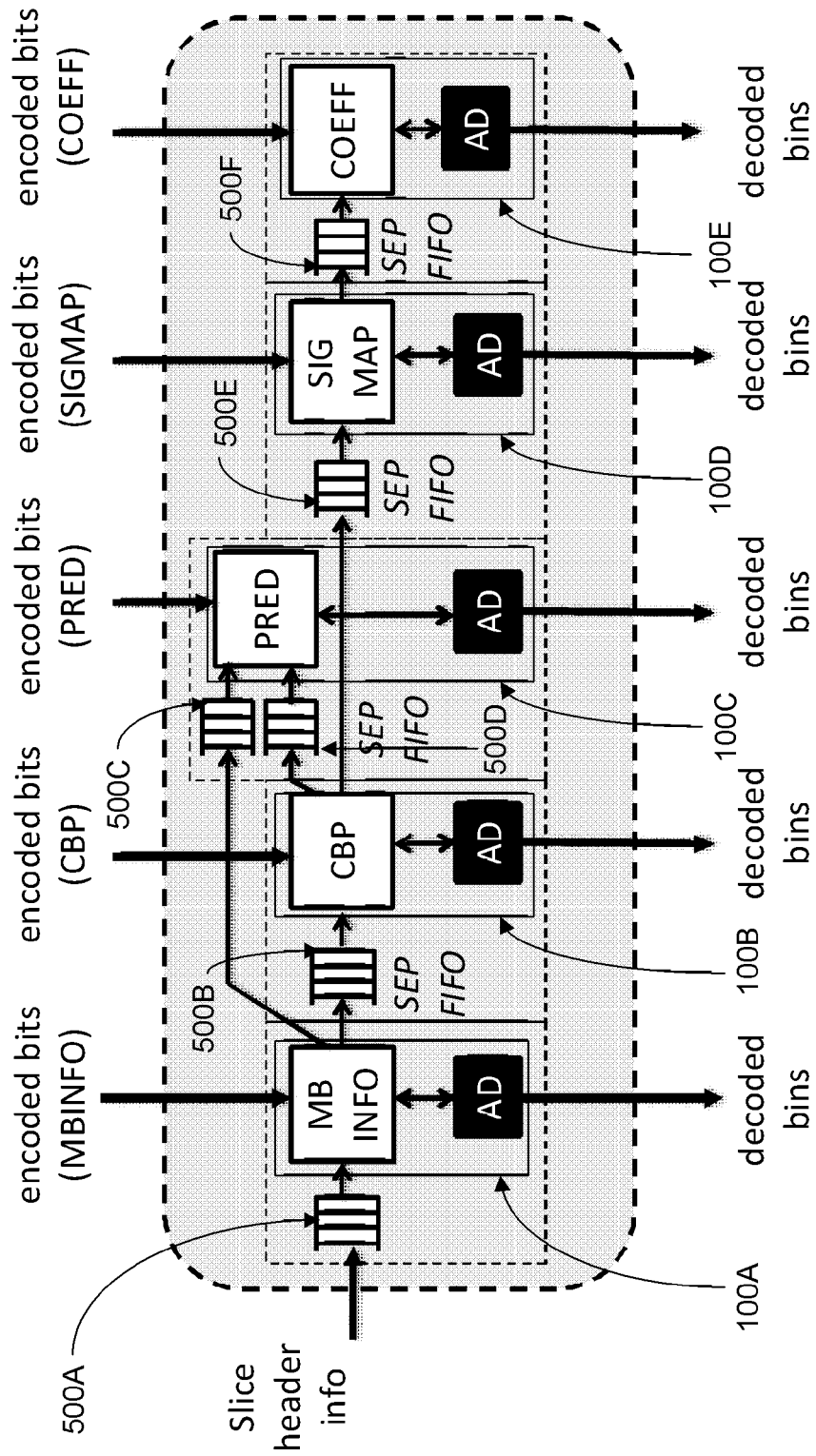
FIG. 11 is a schematic diagram providing an example of an architecture for CABAC engines run in parallel, using FIFOs.

To allow for the parallel processing, as previously described, and in light of dependencies of different syntax element groups, data driven first-in-first-out buffers (FIFOs) can be used between CABAC engines. It should be noted that while FIG. 11 illustrates use of the FIFOs in a decoder, the present invention is not limited to use of FIFOs in a decoder, but instead, may also pertain to use of FIFOs in an encoder.

The groups of syntax elements MBINFO, PRED and CBP rely on information from the top macroblock for context selections. As a result, they require a last line buffer. Each of these groups has an independent last line buffer so that the engines can process different macroblocks at the same time FIG. 11 is a schematic diagram providing an example of an architecture for CABAC engines 100 run in parallel, using FIFOs 500. FIG. 11 illustrates CABAC decoding engines 100, wherein the combination of a context modeler (MBINFO, CBP, PRED, SIGMAP, COEFF) and a binary arithmetic decoder (AD) represents a CABAC decoding engine 100.

As previously mentioned, the CABAC engines 100 run in parallel. The bitstreams for each partition are fed to their respective context modelers. The AD of each CABAC engine 100 outputs the decoded bins (and syntax elements) for each partition. To address the dependencies previously mentioned, and as shown in FIG. 9 and FIG. 10 a FIFO 500 is inserted between each CABAC engine 100. These syntax element partition FIFOs synchronize the CABAC engines 100 so that they can decode the syntax elements of different macroblocks in parallel as shown in FIG. 10. It should be noted that any slice header information is also fed to the MBINFO CABAC engine 100A.

In accordance with the present invention, much of the existing H.264/AVC architecture can be reused for the present invention. This process basically involves breaking up the context selection finite-state-machine (FSM) into multiple FSM with fewer states. It should be noted that the total number of states should be the same, which is equal to the number of contexts. This can be done by changing a subset of the transitions. As a result, this solution can be integrated into a multi-standard solution that supports H.264/AVC.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

We claim:

1. A method for execution in hardware, providing high throughput entropy coding, comprising the steps of:
dividing syntax elements of video into one or more group of syntax elements;
placing each group into a separate partition, resulting in more than one partition;
processing more than one of the more than one partition in parallel using entropy coding, and
using a quantization parameter to combine a number of partitions into fewer partitions.

2. The method of claim 1, further comprising the step of using first-in-first-out queuing to manage dependencies between engines processing the one or more partitions.

3. The method of claim 1, wherein the high throughput entropy coding is provided by a context-based adaptive binary arithmetic coding engine.

4. The method of claim 1, wherein the entropy coding is performed using more than one entropy coding engine that works in parallel.

5. The method of claim 4, wherein the entropy coding engine is a context-based adaptive binary arithmetic coding engine.

6. The method of claim 4, wherein each syntax element is placed into a different group of syntax elements and wherein each group of syntax elements is provided to a different entropy coding engine.

7. A method for execution in hardware, providing high throughput entropy coding, comprising the steps of:
dividing syntax elements of video into one or more group of syntax elements;

placing each group into a separate partition, resulting in more than one partition; and processing more than one of the more than one partition in parallel using entropy coding, wherein the step of dividing syntax elements of video into one or more group of syntax elements is further defined by the steps of:

running video processing simulations on multiple video streams of the video using entropy coding to determine an average number of bins per syntax element; and grouping together syntax elements with a low number of bins so as to distribute syntax elements into the one or more groups of syntax elements.

8. A method for execution in hardware, providing high throughput entropy coding, comprising the steps of:

dividing syntax elements of video into one or more group of syntax elements;

placing each group into a separate partition, resulting in more than one partition; and processing more than one of the more than one partition in parallel using entropy coding, wherein the entropy coding is performed using more than one entropy coding engine that works in parallel, wherein the step of processing more than one of the more than one partition in parallel further comprises using at least one first-in-first-out buffer located between entropy coding engines to address dependencies between syntax element groups.

9. A method for execution in hardware, providing high throughput entropy coding, comprising the steps of:

dividing-syntax elements of video into one or more group of syntax elements;

placing each group into a separate partition, resulting in more than one partition; and processing more than one of the more than one partition in parallel using entropy coding, wherein the entropy coding is performed using more than one entropy coding engine that works in parallel, and, wherein the step of dividing syntax elements of video into one or more groups of syntax elements is further defined by the steps of receiving a predefined average number of bins per syntax element for a video standard associated with the video;

pre-grouping categories of syntax elements into pre-grouped syntax element groups so as to provide similar workload for each entropy coding engine;

receiving the syntax elements of the video;

sorting and grouping the received syntax elements of the video into the pre-grouped syntax element groups; and providing each different category of syntax elements to a different entropy coding engine for parallel processing.

10. A system for providing high throughput entropy coding, comprising:

at least two entropy coding engines; and a computer having:
  a memory; and
  a processor configured by the memory to perform the steps of:
    dividing syntax elements of video into one or more group of syntax elements;
    placing each group into a separate partition, resulting in more than one partition; and
    providing each separate partition to a separate one of the at least two entropy coding engines,
  wherein the at least two entropy coding engines process the separate partitions in parallel using entropy coding, and wherein the processor is configured by the memory to perform the step of using a quantization parameter to combine a number of partitions into fewer partitions.

11. The system of claim 10, wherein the system further comprises at least one first-in-first-out queuing buffer to manage dependencies between syntax element groups between engines processing the one or more partitions.

12. The system of claim 10, wherein the entropy coding engines are context-based adaptive binary arithmetic coding engines.

13. A system for providing high throughput entropy coding, comprising:

at least two entropy coding engines; and a computer having:
  a memory; and
  a processor configured by the memory to perform the steps of:
    dividing syntax elements of video into one or more group of syntax elements;
    placing each group into a separate partition, resulting in more than one partition; and
    providing each separate partition to a separate one of the at least two entropy coding engines,
  wherein the at least two entropy coding engines process the separate partitions in parallel using entropy coding, and
  wherein the step of dividing syntax elements of video into one or more group of syntax elements is further defined by the steps of:
    running video processing simulations on multiple video streams of the video using entropy coding to determine an average number of bins per syntax element; and
    grouping together syntax elements with a low number of bins so as to distribute syntax elements into the one or more groups of syntax elements.

14. A system for providing high throughput entropy coding, comprising:

at least two entropy coding engines; and a computer having:
  a memory; and
  a processor configured by the memory to perform the steps of:
    dividing syntax elements of video into one or more group of syntax elements;
    placing each group into a separate partition, resulting in more than one partition; and
    providing each separate partition to a separate one of the at least two entropy coding engines,
  wherein the at least two entropy coding engines process the separate partitions in parallel using entropy coding,
wherein the step of dividing syntax elements of video into one or more groups of syntax elements is further defined by the steps of:
  receiving a predefined average number of bins per syntax element for a video standard associated with the video;
  pre-grouping categories of syntax elements into pre-grouped syntax element groups so as to provide similar workload for each entropy coding engine;
  receiving the syntax elements of the video;
  sorting and grouping the receiving syntax elements of the video into the pre-grouped syntax element groups; and
  providing each different category of syntax elements to a different entropy coding engine for parallel processing.

* * * * *